(12) United States Patent
Lin

(10) Patent No.: US 11,469,551 B2
(45) Date of Patent: Oct. 11, 2022

(54) ELECTRONIC DEVICE AND POWER DISTRIBUTION APPARATUS USED THEREWITH

(71) Applicant: DELTA ELECTRONICS, INC., Taoyuan (TW)

(72) Inventor: Cheng-Chun Lin, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 274 days.

(21) Appl. No.: 16/835,259

(22) Filed: Mar. 30, 2020

(65) Prior Publication Data

US 2021/0126400 A1 Apr. 29, 2021

(30) Foreign Application Priority Data

Oct. 28, 2019 (CN) .......................... 201911031233.7

(51) Int. Cl.
*H01R 13/645* (2006.01)
*H02B 1/46* (2006.01)
*H05K 5/02* (2006.01)

(52) U.S. Cl.
CPC .......... *H01R 13/6456* (2013.01); *H02B 1/46* (2013.01); *H05K 5/0217* (2013.01)

(58) Field of Classification Search
CPC ...... H01R 13/64; H01R 13/6456; H02B 1/46; H05K 5/0217
USPC ....................................................... 439/374
See application file for complete search history.

(56) References Cited

U.S. PATENT DOCUMENTS

| | | | | |
|---|---|---|---|---|
| 5,187,645 A | * | 2/1993 | Spalding | G06F 1/1615 361/679.41 |
| 6,520,792 B2 | * | 2/2003 | Chen-Chiang | H01R 13/6395 439/373 |
| 8,149,586 B2 | | 4/2012 | Curnalia et al. | |
| 2010/0227493 A1 | * | 9/2010 | Guy | H01R 31/06 439/345 |
| 2011/0211300 A1 | * | 9/2011 | Mori | G06F 1/1656 361/679.01 |
| 2012/0108088 A1 | * | 5/2012 | Peng | H01R 13/5213 439/135 |

FOREIGN PATENT DOCUMENTS

| | | |
|---|---|---|
| CN | 104901058 B | 11/2017 |
| CN | 208674526 U | 3/2019 |
| DE | 2119709 B2 | 3/1980 |
| DE | 2119709 C3 | 2/1986 |
| GB | 1429371 A | 3/1976 |
| TW | M503728 U | 6/2015 |

* cited by examiner

*Primary Examiner* — Oscar C Jimenez
(74) *Attorney, Agent, or Firm* — CKC & Partners Co., LLC

(57) ABSTRACT

An electronic device includes a first main body, a first electrical connector, and an insert member. The first main body has an insertion end and one or more holes located at the insertion end. The first electrical connector is disposed at the insertion end. The insert member is coupled to the first main body through the one or more holes and includes a plurality of ribs and a plurality of removed portions. Each of the ribs extends away from the insertion end. The ribs and the removed portions are sequentially and linearly arranged according to a coding pattern.

20 Claims, 9 Drawing Sheets

ELECTRONIC DEVICE AND POWER DISTRIBUTION APPARATUS USED THEREWITH

CROSS-REFERENCE TO RELATED APPLICATION

This application claims priority to China Application Serial Number 2019/1031233.7, filed Oct. 28, 2019, which is herein incorporated by reference.

BACKGROUND

Technical Field

The present disclosure relates to an electronic device and a power distribution apparatus used therewith, and more particularly, to an electronic device and a power distribution apparatus for insertion of the electronic device.

DESCRIPTION OF RELATED ART

Generally speaking, male and female parts that can be plugged to each other and unplugged are usually designed with fool-proof design to prevent problems such as assembly errors or component damages. One conventional approach is to make a difference on the housings. That is, when manufacturing the male and female parts, specific housings are directly manufactured with matching foolproof mechanisms thereon. However, the aforementioned conventional approach cannot be applied to finished products that have been sold. If the aforementioned conventional approach is to be applied to these finished products, the housing of each finished product must be modified. However, if there are dozens of types of finished products currently sold, there will be too many factors involved, which may create issues such as shipment control, quality, and cost. Accordingly, how to provide an electronic device to solve the aforementioned problems becomes an important issue to be solved by those in the industry.

SUMMARY

According to an embodiment of the disclosure, an electronic device includes a first main body, a first electrical connector, and an insert member. The first main body has an insertion end and one or more holes located at the insertion end. The first electrical connector is disposed at the insertion end. The insert member is coupled to the first main body through the one or more holes and includes a plurality of ribs and a plurality of removed portions. Each of the ribs extends away from the insertion end. The ribs and the removed portions are sequentially and linearly arranged according to a coding pattern.

According to an embodiment of the disclosure, a power distribution apparatus includes a second main body, a second electrical connector, and a foolproof member. The second main body has a slot configured to be inserted by the abovementioned electronic device. The second electrical connector is disposed in the slot. The foolproof member is partially disposed in the slot and includes a plurality of blocking bars and a plurality of notches facing an entrance of the slot. The blocking bars and the notches are sequentially and linearly arranged according to the coding pattern. When the electronic device is inserted into the slot and the first electrical connector is connected to the second electrical connector, the ribs are at least partially located in the notches correspondingly, and the removed portions are aligned with the blocking bars correspondingly.

DETAILED DESCRIPTION

Figure 1:
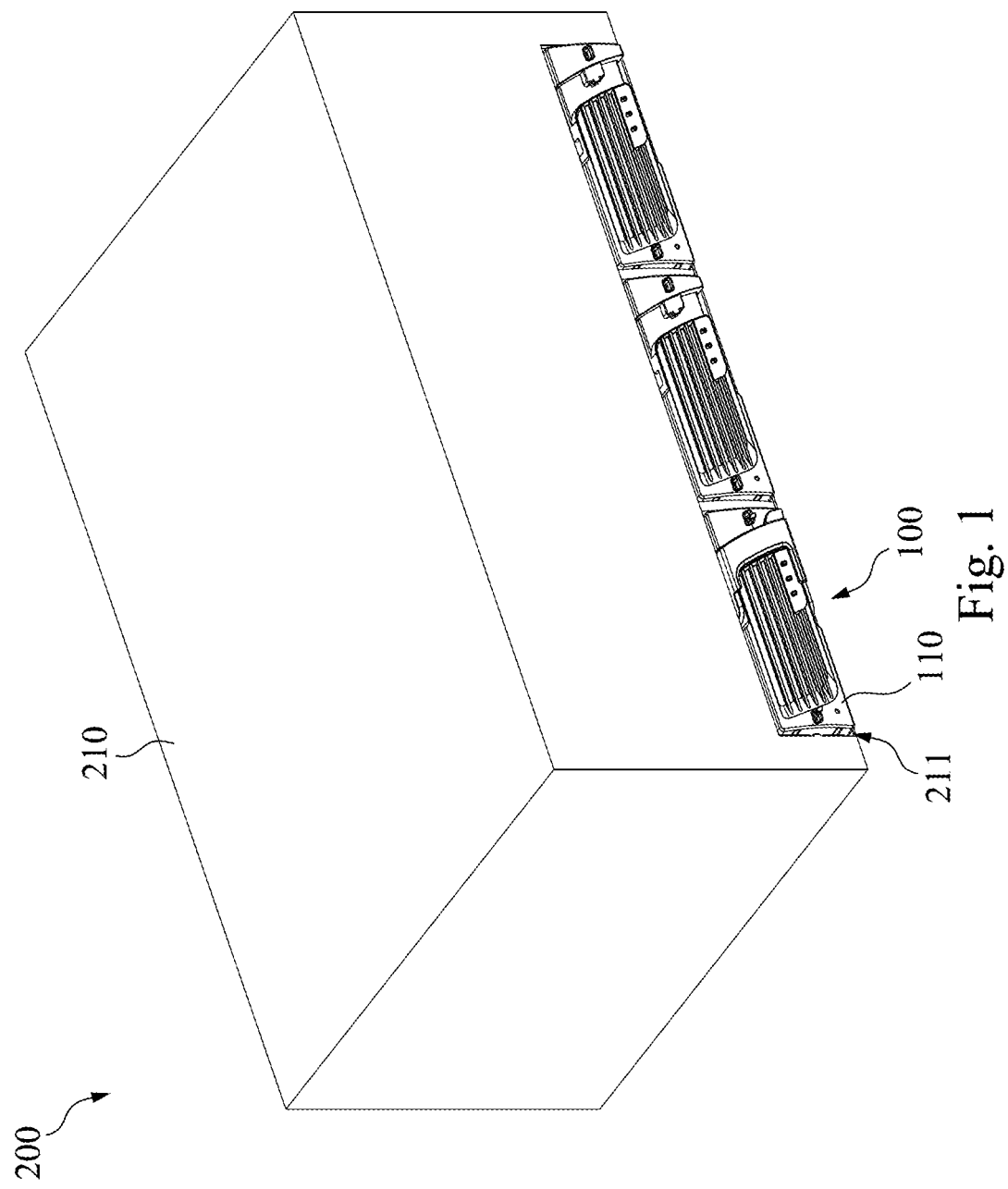
FIG. 1 is a perspective view of an electronic device and a power distribution apparatus according to an embodiment of the present disclosure.

Referring to FIG. 1, the electronic device 100 includes a first main body 110. The power distribution apparatus 200 includes a second main body 210. The second main body 210 has a slot 211. The slot 211 is configured to receive the electronic device 100 inserted into the slot 211. In some embodiments, the power distribution apparatus 200 is, for example, a charger. In some embodiments, the power distribution apparatus 200 is, for example, a rectifier, an inverter, a converter, or a solar charger, but the disclosure is not limited in this regard. The power distribution apparatus 200 may also be configured in a shelf rack structure.

Figure 2A:
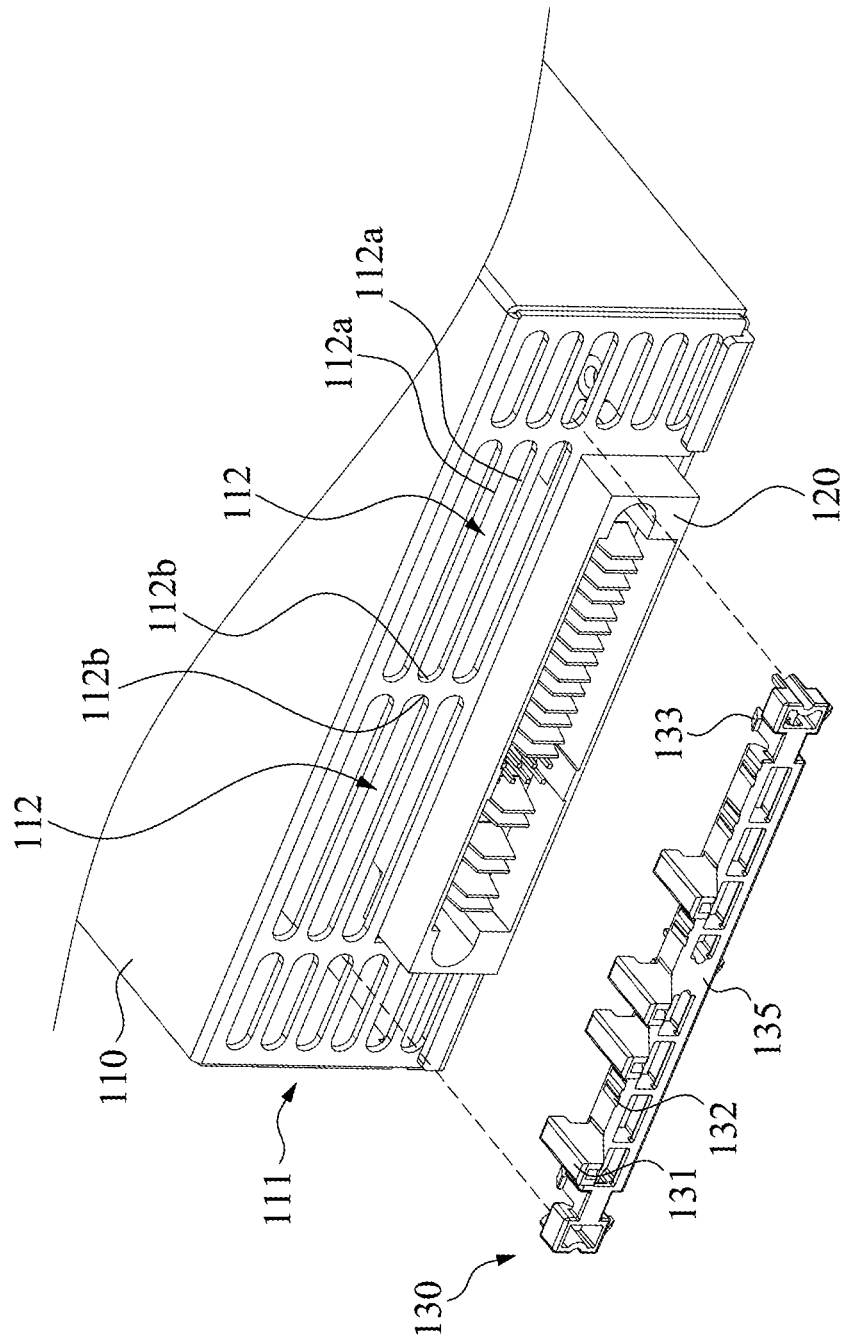
FIG. 2A is a perspective view of the electronic device according to an embodiment of the present disclosure, in which an insert member is separated from a first main body.
Figure 2B:
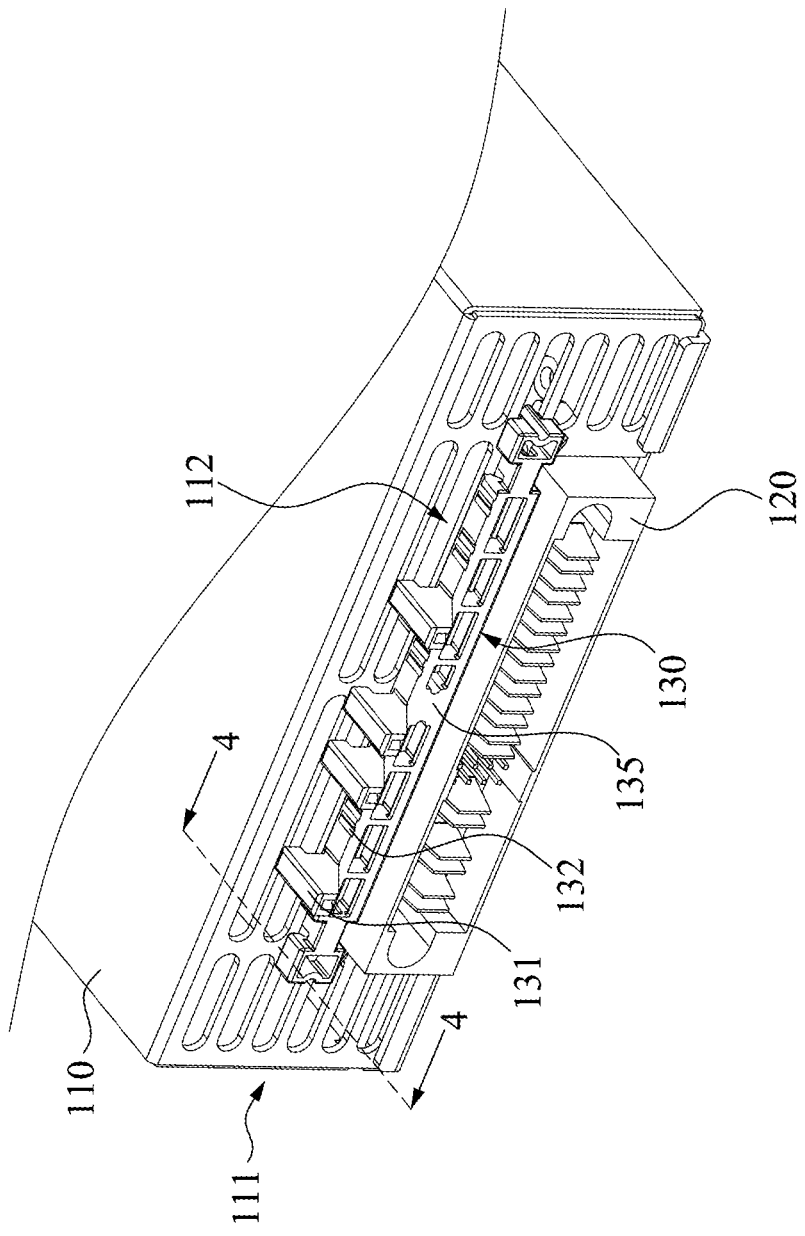
FIG. 2B is another perspective view of the electronic device as shown in FIG. 2A, in which the insert member is coupled to the first main body.

Referring to FIG. 2A and FIG. 2B, according to an embodiment a first main body 110 of the electronic device 100 includes an insertion end 111 and a plurality of holes 112 located at the insertion end 111. The electronic device 100 further includes a first electrical connector 120 and an insert member 130. The first electrical connector 120 is disposed at the insertion end 111. The insert member 130 is coupled to the first main body 110 at the holes 112 and includes a plurality of ribs 131, a plurality of removed portions 132, and a first base 135. The ribs 131 are connected to and arranged on the first base 135. The ribs 131 and the removed portions 132 are sequentially and linearly arranged according to a coding pattern. Each of the ribs 131 extends away from the insertion end 111.

Figure 3:
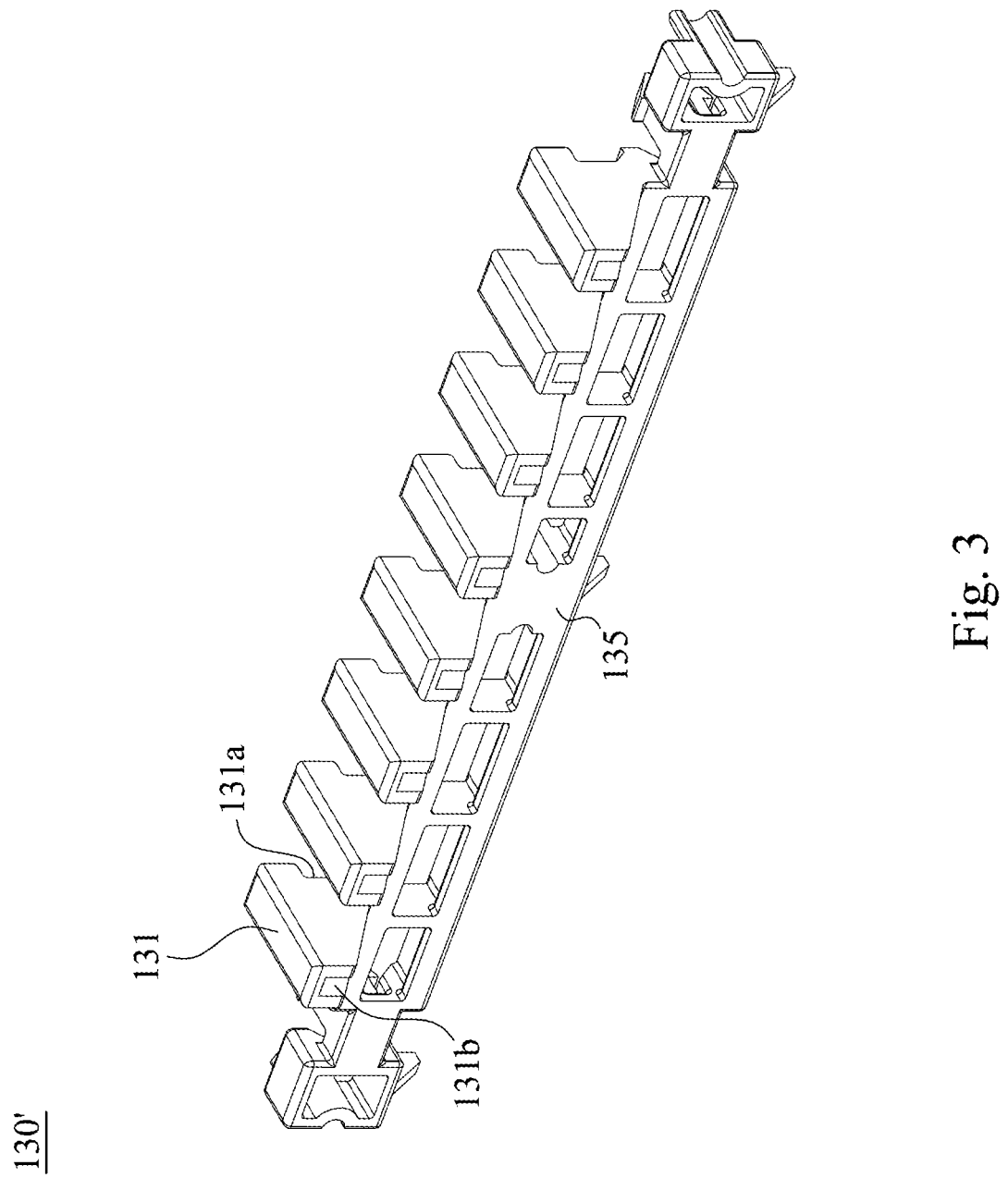
FIG. 3 is a perspective view of an uncoded insert member according to an embodiment of the present disclosure.
Figure 4:
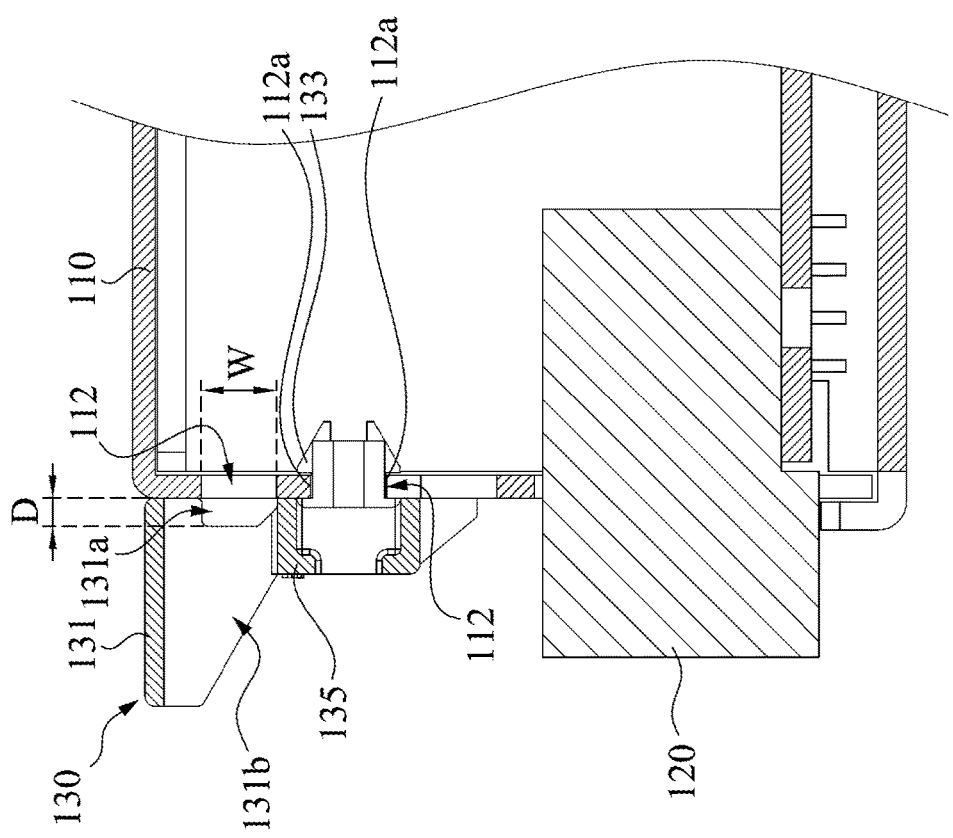
FIG. 4 is a partial cross-sectional view of the electronic device as shown in FIG. 2B taken along line 4-4.

Referring to FIG. 3, according to an embodiment, an uncoded insert member 130' includes eight ribs 131 that are equally spaced and linearly arranged. The number and configuration of the ribs 131 of the uncoded insert member 130' may be according to user requirements and is not limited by FIG. 3. By removing selected ribs 131 (e.g., cutting from roots of the ribs 131), the insert member 130 as shown in FIG. 2A can be obtained, in which remaining portions of the ribs 131 after being cut can be regarded as the removed portions 132. In some embodiments, as shown in FIG. 4, the rib 131 has an end proximal to the first base 135 and an end distal to the first base 135. As shown, a width of the end proximal to the first base 135 is smaller than a width of the end distal to the first base 135. In some embodiments, the shape of the rib 131 is triangular.

As shown in FIG. 4, one of the ribs 131 has a recess 131a. The recess 131a faces the insertion end 111 of the first main body 110 and is located adjacent to at least a part of one hole 112 at the insertion end 111. For example, the hole 112 may be a heat vent of the electronic device 100 disposed at the insertion end 111. Therefore, with a structural configuration that the recess 131a on the rib 131 is located adjacent to the hole 112, the flow of hot air expelled by the electronic device 100 from the hole 112 is not directly blocked by the rib 131. This feature thus reduces the influence of the insert member 130 on the heat dissipation efficiency of the electronic device 100 that dissipates heat through the hole 112. All of the ribs 131 shown in FIG. 2A have recesses 131a, but the disclosure is not limited in this regard. In practical applications, only the rib 131 located adjacent to a corresponding hole 112 may be provided with a recess 131a. In some embodiments, as shown in FIG. 4, a contour of the recess 131a is U-shaped, and the recess 131a extends away from the hole 112.

In some embodiments, the hole 112 of the first main body 110 has a width W, the recess 131a has a depth D, and the width W is configured to be substantially equal to or greater than the depth D. This feature provides for the influence of the rib 131 on the heat dissipation efficiency of the hole 112 to be more effectively reduced. In some embodiments, as shown in FIG. 2A, a shape of one of the holes 112 of the first main body 110 may be elongated and having upper and lower edges 112a. The aforementioned width W may be defined as the distance between the upper and lower edges 112a, for example. In some other embodiments, one of the holes 112 of the first main body 110 is round shaped, and the aforementioned width W may be defined as the diameter of the hole 112, for example.

Figure 5:
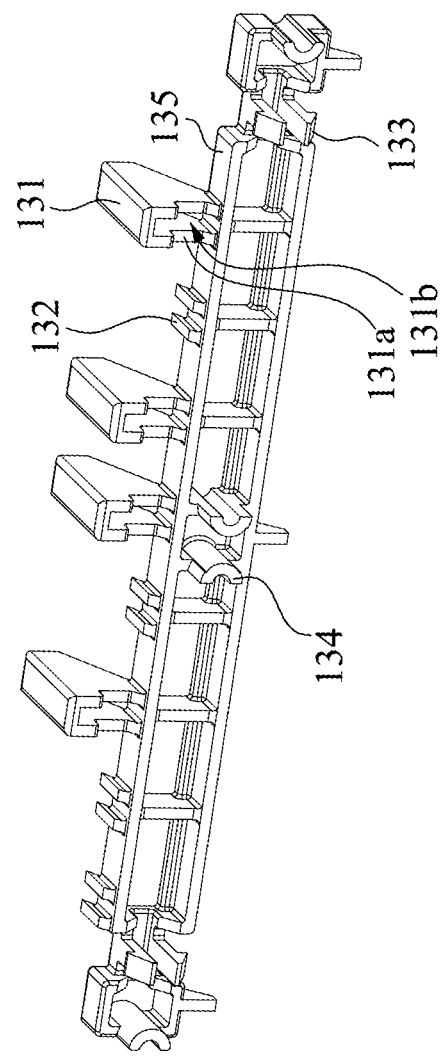
FIG. 5 is another perspective view of the insert member as shown in FIG. 2A.

Referring to FIG. 5, in the present embodiment, the rib 131 further has a hollow portion 131b. The hollow portion 131b may be aligned with at least a part of the hole 112 and configured to guide air flowing out of the hole 112 to dissipate heat. For example, the hollow portion 131b includes a channel, and the air flowing out is guided away from the hole 112 by the channel. With this feature, the hot air discharged from the hole 112 of the electronic device 100 can be guided away from the insertion end 111 through the hollow portion 131b, and the influence of the rib 131 on the heat dissipation efficiency of the hole 112 can also be reduced. Furthermore, in the present embodiment, the hollow portion 131b is in spatial communication with the recess 131a, and the hot air discharged from the hole 112 may be dissipated through multiple paths (i.e., laterally dissipated at the recess 131a or dissipated through the hollow portion 131b after passing through the recess 131a). This may further reduce the influence of the rib 131 on the heat dissipation efficiency of the hole 112.

Referring to FIG. 4 and FIG. 2B, in the present embodiment, the insert member 130 further includes two buckle structures 133. The buckle structures 133 are inserted into the hole 112 and abut against upper and lower edges 112a of the hole 112. The two buckle structures 133 are hook-shaped and are buckled on an inner surface of the insertion end 111 of the first main body 110, so that the insert member 130 can be more firmly coupled to the insertion end 111 of the first main body 110 and cannot be easily detached.

The insert member 130 may further include two positioning structures 134, as shown in FIG. 5. The two positioning structures 134 may be inserted into two adjacent holes 112 and abut against two inner edges 112b of adjacent holes 112. This clip feature provides the insert member 130 to be more firmly positioned at the insertion end 111 of the first main body 110.

In an embodiment, a box-shaped electronic device 100 is configured with the holes 112 to allow a fan (not shown) disposed inside the first main body 110 to discharge the heat generated during the operation of the electronic device 100 from the holes 112 for air cooling the electronic device 100. If the holes 112 and the first electrical connector 120 are disposed at the same end (i.e., the insertion end 111), and the other surfaces of the first main body 110 are covered by a housing, the first main body 110 can be inserted into the slot 211 (referred to FIG. 6A and FIG. 6B) of the power distribution apparatus 200 in a forward direction, and avoid the need for the power distribution apparatus 200 to provide for additional space in the slot. It is worth noting that the configuration and structure of the insert member 130 of the present embodiment take into consideration of how to couple the insert member 130 with the hole 112 (e.g., by coupling to the two edges 112a of the hole 112 through the buckle structures 133) and how to reduce or avoid the blocking to the exhaust and heat dissipation of the hole 112 (e.g., through the recess 131a and the hollow portion 131b).

Further, as shown by the embodiment in FIG. 4, the rib 131 abuts against a surface of the insertion end 111 of the first main body 110. This structural configuration provides for a compliant design, such that the rib 131 is unlikely to be easily damaged even if an interference collision occurs during the insertion of the electronic device 100 into the slot 211 of the power distribution apparatus 200.

Figure 6A:
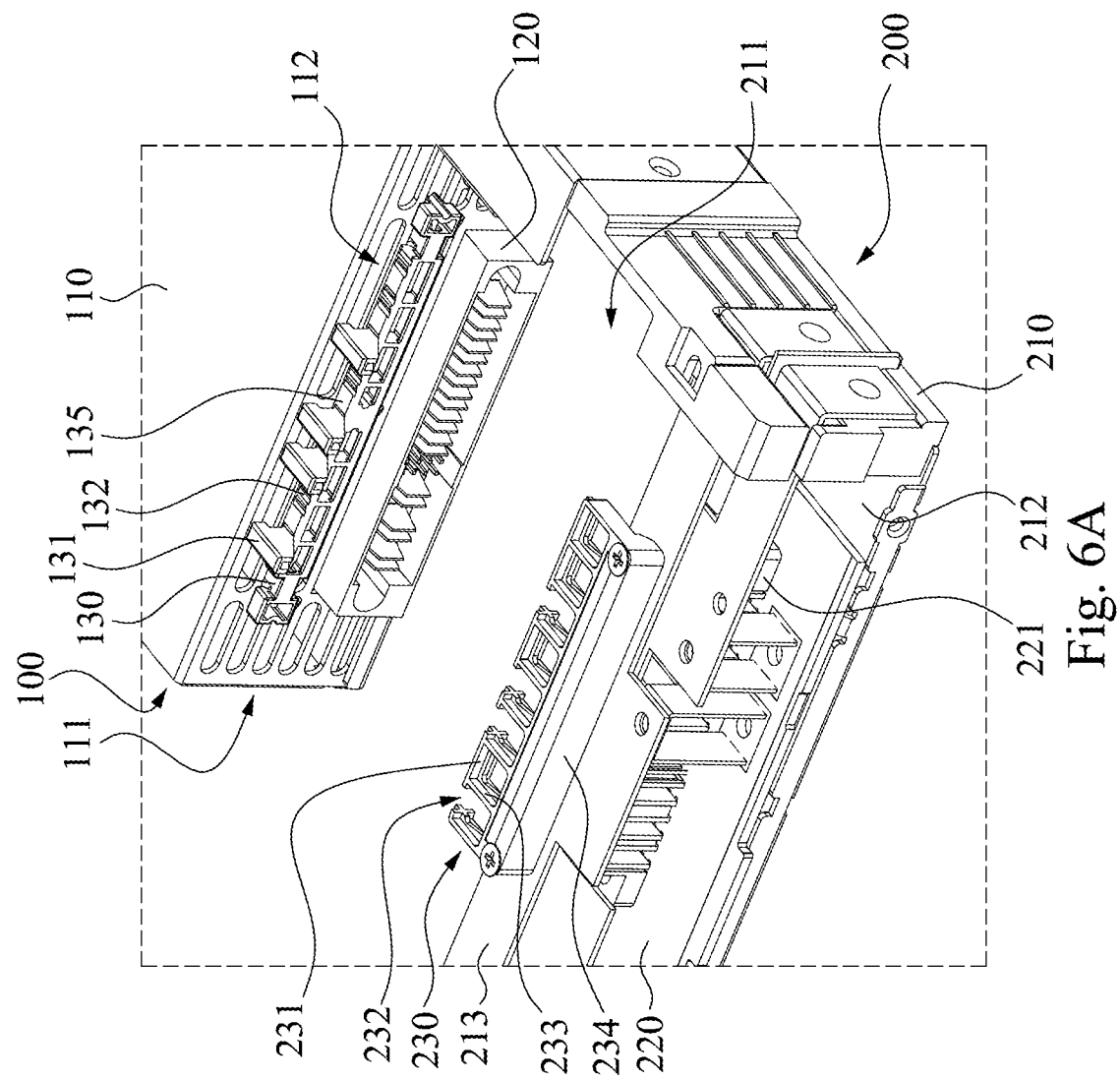
FIG. 6A is a perspective view of the electronic device and a portion of the power distribution apparatus as shown in FIG. 1, in which a first electrical connector is not yet connected to a second electrical connector.
Figure 6B:
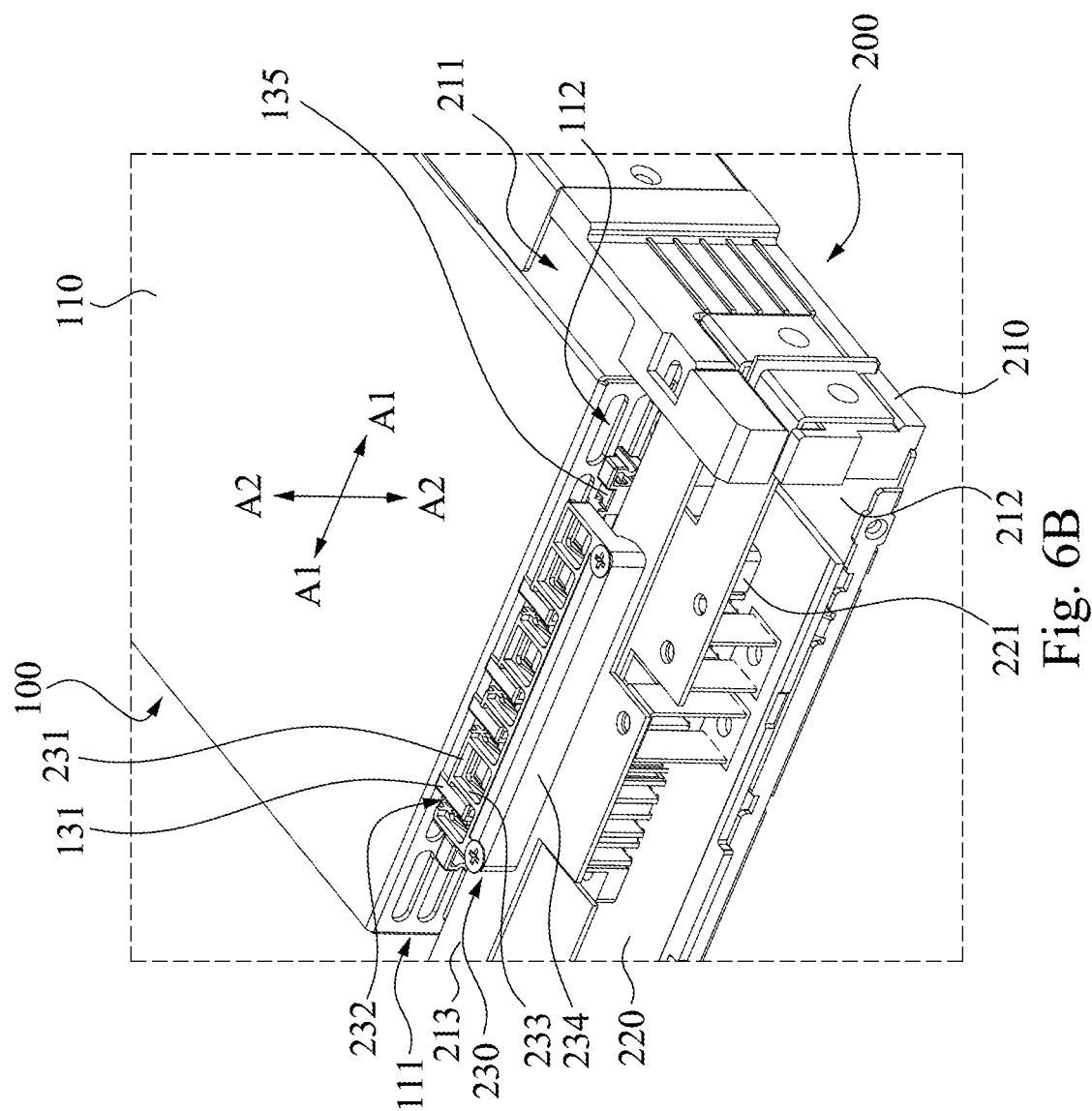
FIG. 6B is another perspective view of the electronic device and a portion of the power distribution apparatus as shown in FIG. 1, in which the first electrical connector is connected to the second electrical connector.

Reference is made to FIG. 6A and FIG. 6B. To better understand how the electronic device 100 can cooperate with the power distribution apparatus 200, FIGS. 6A and 6B only show a portion of the second main body 210 of the power distribution apparatus 200. In the present embodiment, the power distribution apparatus 200 further includes a circuit board 220 and a foolproof member 230. The circuit board 220 and the foolproof member 230 are disposed in the slot 211 of the power distribution apparatus 200. The circuit board 220 is disposed on a bottom plate 212 of the power distribution apparatus 200 and includes a second electrical connector 221. In some embodiments, the power distribution apparatus 200 may include a top plate 213 opposite to the bottom plate 212, and the foolproof member 230 is fixed to the top plate 213. In some embodiments, the top plate 213 of the power distribution apparatus 200 is a shelf plate located inside the second main body 210. In some embodiments, the top plate 213 of the power distribution apparatus 200 is a plate constituting the appearance of the second main body 210.

The foolproof member 230 includes a plurality of blocking bars 231 and a plurality of notches 232. The blocking bars 231 and the notches 232 are sequentially and linearly arranged corresponding to the aforementioned coding pattern. The notches 232 face an entrance of the slot 211. When the electronic device 100 is inserted from the entrance of the slot 211 into the slot 211, and the first electrical connector 120 connects to the second electrical connector 221 (as shown in FIG. 6B), the ribs 131 of the insert member 130 are partially located in the corresponding notches 232 of the foolproof member 230, and the removed portions 132 of the insert member 130 are aligned correspondingly with the blocking bars 231 of the foolproof member 230. More specifically, as shown in FIG. 6B with reference to FIG. 6A, when the electronic device 100 is inserted into the slot 211 and the first electrical connector 120 is connected to the second electrical connector 221, the ribs 131 and the blocking bars 231 are arranged in a first axial direction A1, and the removed portions 132 are aligned with the blocking bars 231 respectively in a second axial direction A2. With the structural configuration in which the combination of the ribs 131 and the removed portions 132 on the insert member 130, and the combination of the notches 232 and the blocking bars 231 on the foolproof member 230 are sequentially and linearly arranged according to a corresponding coding pattern, there would be no mis-match or rejection when the electronic device 100 is inserted into the slot 211 of the power distribution apparatus 200. Accordingly, such insertion can be characterized as fool-proof. That is, a user does not need to know if he/she is inserting a correct corresponding unit, and a successful connection means the units are correctly matched.

Regarding the coding pattern, for example using binary coding, if a character 1 represents a rib 131 and a character 0 represents a removed portion 132, for the insert member 130, the coding pattern of the ribs 131 and the removed portions 132 in FIG. 6B can be interpreted as 10110100 from left to right. Correspondingly, for the foolproof member 230, if a character 1 represents a notch 232 and a character 0 represents a blocking bar 231, the coding pattern of the notches 232 and the blocking bars 231 in FIG. 6B can be interpreted as 10110100 from left to right. In other words, the coding pattern adopted by the combination of the ribs 131 and the removed portions 132 is identical to the coding pattern adopted by the combination of the notches 232 and the blocking bars 231. However, it is noted that the coding patterns does not need to be identical, and other non-identical coding patterns may be used, as long as the ribs 131 and blocking bars 231 are not configured such that they obstruct each other which prevents insertion connection of the electronic device 100 and the power distribution apparatus 200.

Figure 7:
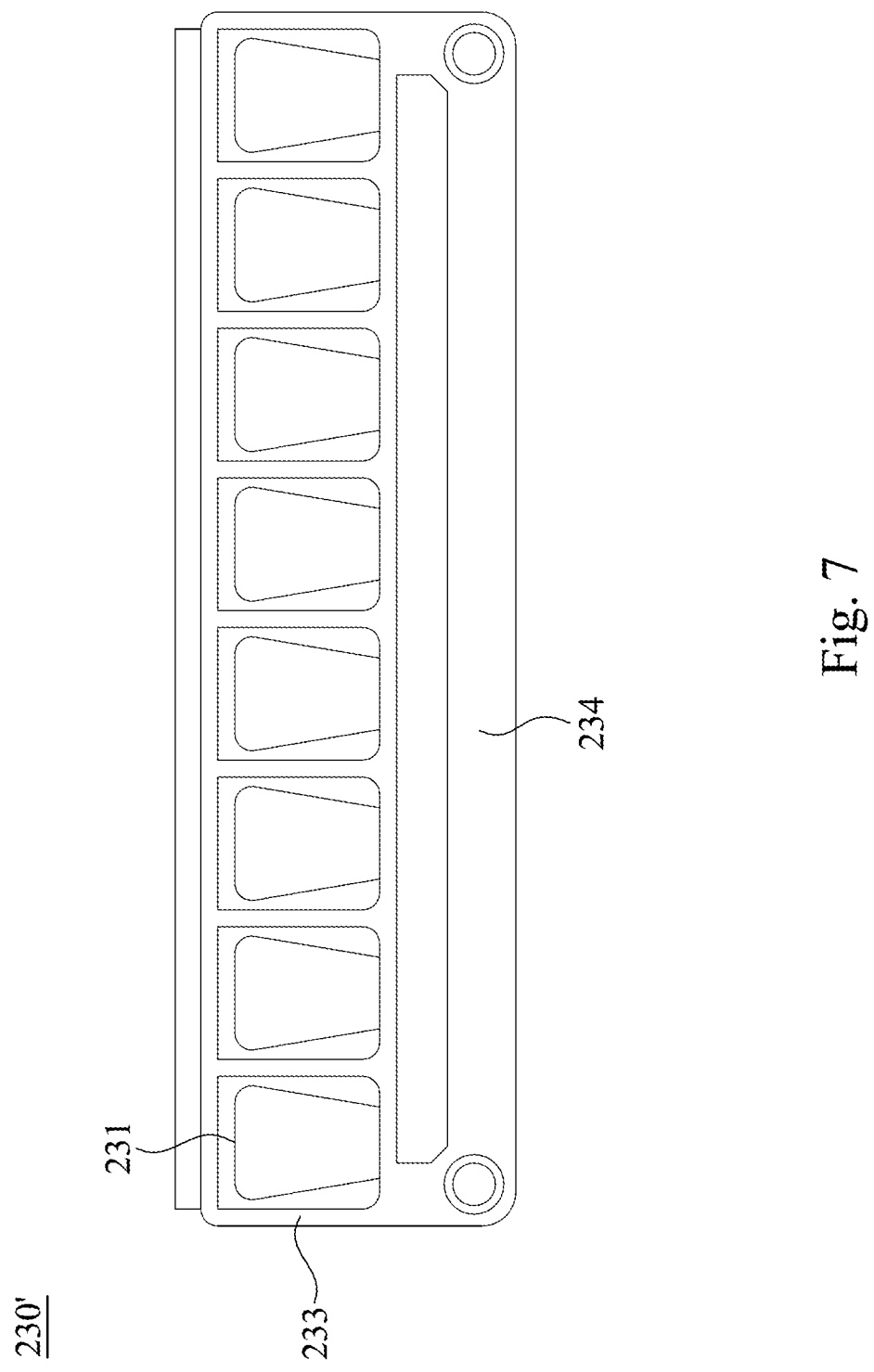
FIG. 7 is a top view of an uncoded foolproof member according to an embodiment of the present disclosure.

Referring to FIG. 7, an uncoded foolproof member 230' is shown which includes a plurality of side bars 233 that are equally spaced and linearly arranged and a second base 234. The side bars 233 are connected to and arranged on the second base 234. Two ends of each of the blocking bars 231 are respectively connected to adjacent two of the side bars 233. In the present embodiment, all of the blocking bars 231 of the uncoded foolproof member 230' are sequentially and linearly connected in series. By removing selected blocking bars 231 (e.g., cutting from ends of the blocking bars 231), the foolproof member 230 as shown in FIG. 6A can be obtained, in which vacant portions between any adjacent two side bars 233 after the blocking bars 231 are cut can be defined as the notches 232. In some embodiments, as shown in FIG. 7, one of the side bars 233 has an end proximal to the second base 234 and an end distal to the second base 234, and a width of said end proximal to the second base 234 is greater than a width of said end distal to the second base 234. With this configuration, the structural strength between the side bars 233 and the second base 234 may be increased compared to if the side bars 233 are configured to be parallel with same widths. In some embodiments, a contour of the side bars 233 is triangular. The number and configuration of blocking bars 231 of the uncoded foolproof member 230' may be according to user requirements and is not limited by FIG. 7.

By trimming and encoding the uncoded insert member 130' and the uncoded foolproof member 230', the trimmed insert member 130 and the trimmed foolproof member 230 can be applied to a specific type of electronic device 100 (e.g., one of dozens of sold finished products) and power distribution apparatus 200, wherein the selected coding pattern corresponds with that specific type of electronic device 100 and power distribution apparatus 200, to achieve the foolproof effect. It is noted that if an eight-digit coding pattern is taken as an example, a total of 70 coding patterns can be obtained if setting a requirement that four characters 1 and four characters 0 must be present. In other words, if there are less than 70 types of electronic devices 100 that are to be connected with the power distribution apparatus 200, the coding pattern of a specific one of these 70 combinations can be selected to for use in providing the corresponding insert member 130 and the foolproof member 230.

In applications which it is preferable to not modifying the appearance of the electronic device (including not modifying the molding components, not modifying the processes, and not affecting any design parameters), the foolproof design can be utilized to differentiate the electronic device by attaching an insert member to holes on the main body of the electronic device. Correspondingly, a slot in the power distribution apparatus may be provided with a foolproof member. By sequentially arranging ribs and removed portions on the insert member linearly according to a coding pattern, and sequentially arranging blocking bars and notches on the foolproof member according to a corresponding coding pattern, a foolproof effect can be achieved when the electronic device is inserted into the slot of the power distribution apparatus.

Although the present disclosure has been described in detail with reference to certain embodiments thereof, other embodiments are also envisaged. It will be apparent to those skilled in the art that modifications and variations can be made to the present disclosure and within the scope of the following claims.

What is claimed is:

1. A power distribution apparatus, comprising:
    a second main body having a slot configured to be inserted by an electronic device;
    a second electrical connector disposed in the slot; and
    a foolproof member partially disposed in the slot, the foolproof member comprising a plurality of blocking bars and a plurality of notches facing an entrance of the slot, wherein the blocking bars and the notches are sequentially and linearly arranged according to a coding pattern,
    and wherein when the electronic device is inserted into the slot and a first electrical connector of the electronic device is connected to the second electrical connector, a plurality of ribs of the electronic device are at least partially located in the notches correspondingly, and a plurality of removed portions of the electronic device are aligned with the blocking bars correspondingly.

2. The power distribution apparatus of claim 1, wherein when the electronic device is inserted into the slot and the first electrical connector is connected to the second electrical connector, the ribs and the blocking bars are arranged in a first axial direction, and each of the removed portions is aligned with a corresponding one the blocking bars in a second axial direction.

3. The power distribution apparatus of claim 1, wherein the foolproof member further comprises a plurality of side bars, wherein two ends of each of the blocking bars are respectively connected to adjacent two side bars, and wherein each of the notches is disposed between adjacent two side bars.

4. The power distribution apparatus of claim 3, wherein the foolproof member further comprises a second base, and the side bars are connected to and arranged on the second base.

5. The power distribution apparatus of claim 4, wherein one of the side bars has an end proximal to the second base and an end distal to the second base, and wherein a width of the end proximal to the second base is greater than a width of the end distal to the second base.

6. The power distribution apparatus of claim 4, wherein each of the notches is formed by the second base and adjacent two side bars.

7. The power distribution apparatus of claim 3, wherein a contour of a side bar is triangular.

8. An electronic device, being the electronic device configured to insert into the power distribution apparatus of claim 1, comprising:
   a first main body comprising an insertion end and one or more holes located at the insertion end;
   the first electrical connector disposed at the insertion end; and
   an insert member coupled to the first main body through the one or more holes, the insert member comprising the plurality of ribs and the plurality of removed portions, wherein each of the plurality of ribs extends away from the insertion end, and wherein the ribs and the removed portions are sequentially and linearly arranged according to a coding pattern.

9. The electronic device of claim 8, wherein at least one of the ribs comprises a recess facing the insertion end, and wherein the recess is located adjacent to at least a part of one of the one or more holes located at the insertion end.

10. The electronic device of claim 9, wherein the one of the one or more holes comprises a width, wherein the recess comprises a depth, and wherein the width of the one of the one or more holes is substantially equal to or greater than the depth of the recess.

11. The electronic device of claim 9, wherein the hollow portion is configured to be in spatial communication with the recess, and wherein the hollow portion is aligned with and extends away from the one of the one or more holes located at the insertion end.

12. The electronic device of claim 9, wherein a contour of the recess is U-shaped.

13. The electronic device of claim 8, wherein at least one of the ribs comprises a hollow portion shaped to align with and extend away from one of the one or more holes located at the insertion end.

14. The electronic device of claim 13, wherein the hollow portion comprises a channel configured to guide a flow of air away from the one of the one or more holes located at the insertion end.

15. The electronic device of claim 8, wherein the insert member further comprises a pair of buckle structure inserted into one of the one or more holes, and wherein the pair of buckle structure abut against opposite edges of the one of the one or more holes located at the insertion end.

16. The electronic device of claim 8, wherein the insert member further comprises two positioning structures inserted into two adjacent holes located at the insertion end, and wherein the positioning structures abut against two inner edges of the two adjacent holes.

17. The electronic device of claim 8, wherein at least one of the ribs abuts against a surface of the insertion end.

18. The electronic device of claim 8, wherein the insert member further comprises a first base, and wherein the ribs are connected to the first base and are sequentially and linearly arranged on the first base according to the coding pattern.

19. The electronic device of claim 18, wherein at least one of the ribs comprises an end proximal to the first base and an end distal to the first base, and wherein a width of the end proximal to the first base is smaller than a width of the end distal to the first base.

20. The electronic device of claim 8, wherein a shape of at least one of the ribs is triangular.

* * * * *